United States Patent
Hixson et al.

(10) Patent No.: US 6,780,294 B1
(45) Date of Patent: Aug. 24, 2004

(54) SHIELD ASSEMBLY FOR SUBSTRATE PROCESSING CHAMBER

(75) Inventors: Robert B. Hixson, Portland, OR (US); Gary William Groshong, Brentwood, CA (US); David Bruce Jordan, Alamo, CA (US); Jose Luis Gonzalez, San Lorenzo, CA (US)

(73) Assignee: Set, Tosoh, Dublin, CA (US)

(*) Notice: Subject to any disclaimer, the term of this patent is extended or adjusted under 35 U.S.C. 154(b) by 0 days.

(21) Appl. No.: 10/223,344

(22) Filed: Aug. 19, 2002

(51) Int. Cl.[7] .......................... C23C 14/34; B05C 11/11
(52) U.S. Cl. ................................ 204/298.11; 118/504
(58) Field of Search ...................... 204/298.11; 118/504

(56) References Cited

U.S. PATENT DOCUMENTS

| | | | |
|---|---|---|---|
| 5,529,673 A | 6/1996 | Strauss et al. ......... 204/298.12 |
| 5,658,442 A | 8/1997 | Van Gogh et al. ...... 204/298.12 |
| 5,690,795 A | 11/1997 | Rosenstein et al. ...... 204/192.1 |
| 5,755,936 A * | 5/1998 | Raaijmakers .......... 204/298.11 |
| 5,846,389 A | 12/1998 | Levine et al. ............ 204/192.1 |
| 5,868,847 A | 2/1999 | Chen et al. ................. 118/715 |
| 5,879,523 A * | 3/1999 | Wang et al. ........... 204/298.11 |
| 6,045,670 A | 4/2000 | Adams et al. ......... 204/258.11 |
| 6,051,122 A | 4/2000 | Flanigan ................ 204/288.11 |
| 6,171,453 B1 | 1/2001 | Chung et al. .......... 204/192.12 |
| 2003/0015421 A1 * | 1/2003 | Cha et al. .............. 204/298.19 |

* cited by examiner

Primary Examiner—Steven VerSteeg
(74) Attorney, Agent, or Firm—Holland & Knight LLP

(57) ABSTRACT

Disclosed is a shielding assembly for use within a substrate deposition processing chamber. The shielding assembly permits sputtering and evaporation processes to take place without the target material depositing upon the internal non-disposable surfaces of the chamber. The shielding assembly is of an improved construction which permits it to be uncoupled from an adapter plate without the need for removing the adapter plate from the deposition chamber.

10 Claims, 6 Drawing Sheets

SHIELD ASSEMBLY FOR SUBSTRATE PROCESSING CHAMBER

BACKGROUND OF THE INVENTION

1. Field of the Invention

The present invention relates to semiconductor substrate processing equipment. More particularly, the present invention relates to an improved shield assembly for a vacuum deposition chamber.

2. Description of the Background Art

Semiconductor devices are created by depositing thin layers of metal upon a substrate or wafer. The materials are deposited in predefined configurations and layers to give the device its required electrical properties. Suitable deposited materials include aluminum, titanium, gold, copper, silicon, and/or various metal alloys. The substrate upon which these materials are deposited is typically formed from a semiconductor material.

The deposited material originates from a target located over the substrate being processed. Various techniques are employed in causing the target material to deposit on the underlying substrate. These processes include sputtering and physical vapor deposition (PVD). In each instance a deposition environment is created within a vacuum chamber overlying the substrate.

For example, in PVD the vacuum chamber is filled with a gas such as argon. Thereafter, a negative voltage is applied to the target, with the chamber remaining grounded. The voltage excites the argon gas and transforms it into a plasma state. The plasma state, in turn, results in argon ions bombarding the target and sputtering material therefrom. As a result, a fine layer of target material is deposited upon the underlying substrate.

In all known PVD processes the target material has a tendency to scatter and deposit on surfaces other than the substrate. Over time, the scattered materials accumulate. This build-up can interfere with the normal operation of the chamber. For example, accumulated materials have a tendency to flake off over time and land upon the underlying substrate. This causes defects in the resulting semiconductor devices.

One way to overcome the problems associated with scatter is to periodically clean the interior of the deposition chamber. This can be accomplished through etching or mechanical abrasion techniques. That is, the deposition process is stopped, and the chamber is opened to permit a user to remove scattered deposits via chemicals or with the aid of tools. However, both etching and abrasion result in a premature wearing of the surfaces within the vacuum chamber, which leads to untimely replacement of the chamber.

An alternative to cleaning the chamber is to shield the internal components of the chamber with a disposable lining. This is advantageous in that once a build up of scattered materials collects upon the shield, it can be removed and replaced. This solution is desirable because it avoids any scattered materials from depositing on non-removable areas within the chamber. It also avoids the use of damaging abrasion or etching techniques.

One existing shielding arrangement is illustrated in FIGS. 1 and 2. FIG. 1 is an exploded view of the shield assembly as it is positioned within a vacuum deposition chamber. The assembly includes an adapter plate, a collimator, a lower shield component and a multi-part upper shield assembly. Screws are employed in securing both the lower shield and the multi-component upper shield assembly to the adapter plate. Once secured the shield assembly protects the adapter plate and other components of the chamber against the collection of scattered materials.

Yet, this shield assembly can only be replaced by removing the entire adapter plate (with the shield components attached thereto) from the deposition chamber. Once removed the various shield components are uncoupled from the adapter. Specifically, the lower shield component, and the various pieces of the upper shield component, are unscrewed from the adapter plate. Thereafter, new shield components are secured to the adapter plate. The adapter plate is then secured back within the deposition chamber.

Although the above described shield assembly is effective in preventing the accumulation of scattered materials, it suffers from the drawback of complexity. For example, both the upper and lower shields require multiple interconnections with the adapter. As such, replacement of the shield can only be accomplished by removing the entire adapter plate from the chamber. This requires an extended period of time during which no manufacturing processes are undertaken and the chamber is open to impurities within the atmosphere.

Therefore, there exists a need in the art for an improved shielding assembly which can be easily and quickly removed and replaced from a deposition chamber.

SUMMARY OF THE INVENTION

It is therefore one of the objectives of this invention to enable the quick and easy removal and installation of a shield assembly within a vacuum deposition chamber.

It is also an object of this invention to secure a shield assembly to an adapter plate with a minimal number of parts and/or fasteners.

Still another object of this invention is to prevent the accumulation of scattered materials upon the deposition chamber by way of a shielding arrangement.

These and other objectives are carried out by an improved shield assembly for a substrate processing chamber. The assembly includes an adapter plate that functions to support a target assembly. The plate has a central opening defined by a first cylindrical extent of a first diameter and a second cylindrical extent of a second reduced diameter. The adapter has both upper and lower peripheral edges, with a pair of opposed locking apertures formed within the upper peripheral edge.

The assembly also includes an upper shield component defined by upper and lower peripheral edges. A series of threaded apertures are formed within a lower peripheral edge of the shield, and a pair of opposed flanges are integrally formed upon the upper peripheral edge. Each of the flanges has a locking aperture formed therein. The upper shield additionally includes a side wall that tapers outwardly from an upper to a lower peripheral edge. The shield is positioned within the central opening of the adapter such that the lower peripheral edge of the shield abuts the second cylindrical extent of the adapter. In this orientation, the locking apertures of the upper shield and adapter can be aligned.

The assembly further includes a target collimator. The collimator is defined by a diameter and an apertured peripheral edge. The peripheral edge is positioned adjacent the lower peripheral edge of the upper shield such that the apertures of the collimator are aligned with the threaded apertures of the upper shield.

A lower shield component is also included. This lower shield component is defined by an upper opening of a first diameter and a lower opening of a second reduced diameter. The lower opening functions in receiving a wafer pedestal. The upper opening has a flanged peripheral edge with apertures formed therein. The lower shield is positioned adjacent the peripheral edge of the target collimator, such that the apertures of the collimator are aligned with the apertures of the lower shield.

Finally, a series of threaded fasteners are secured within the apertures of the lower shield, the apertures of the collimator and the threaded apertures of the upper shield. This series of fasteners serves to secure, as a unit, the collimator and the upper and lower shields. Likewise, a pair of locking fasteners are removably secured within the locking apertures of the upper shield and adapter. These locking fasteners permit the collimator, the upper shield, and the lower shield to be removed from the adapter as a unit. In this regard, the first diameter of the lower shield and the diameter of the collimator are smaller than the diameter of the second cylindrical extent of the adapter, thereby permitting removal of the shield assembly from the upper peripheral edge of the adapter.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

The present invention relates to a shielding assembly for use within a substrate processing chamber, such as a vapor deposition or sputter chamber. The shielding assembly permits deposition processes to take place without the sputtered material depositing upon the internal non-disposable surfaces of the chamber. The shielding assembly is of an improved construction which permits it to be uncoupled from an adapter plate without the need for removing the adapter plate from the deposition chamber. The various components of the shield assembly are described in greater detail hereinafter.

Figure 1:
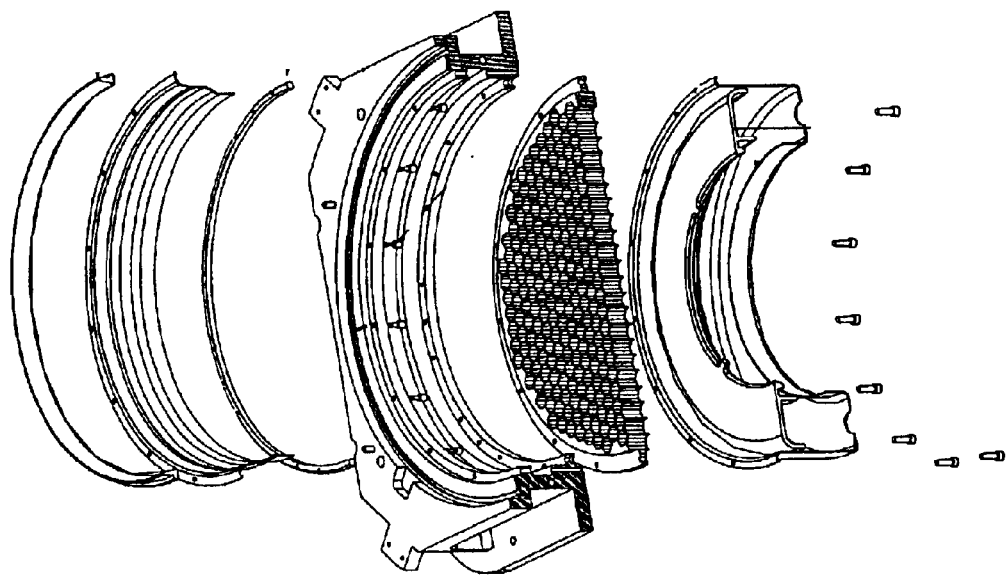
FIG. 1 is an exploded view of an existing shielding assembly.
Figure 2:
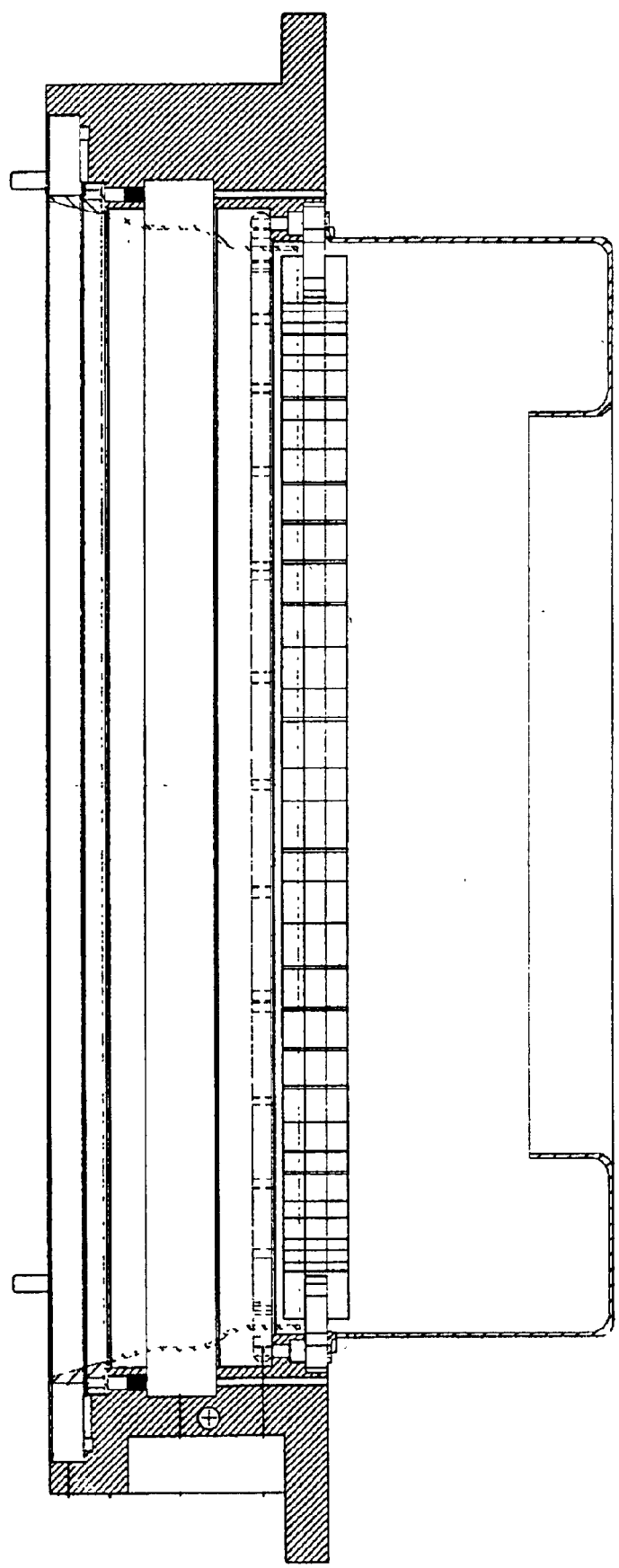
FIG. 2 is a cross-sectional view of the shielding assembly depicted in FIG. 1.
Figure 3:
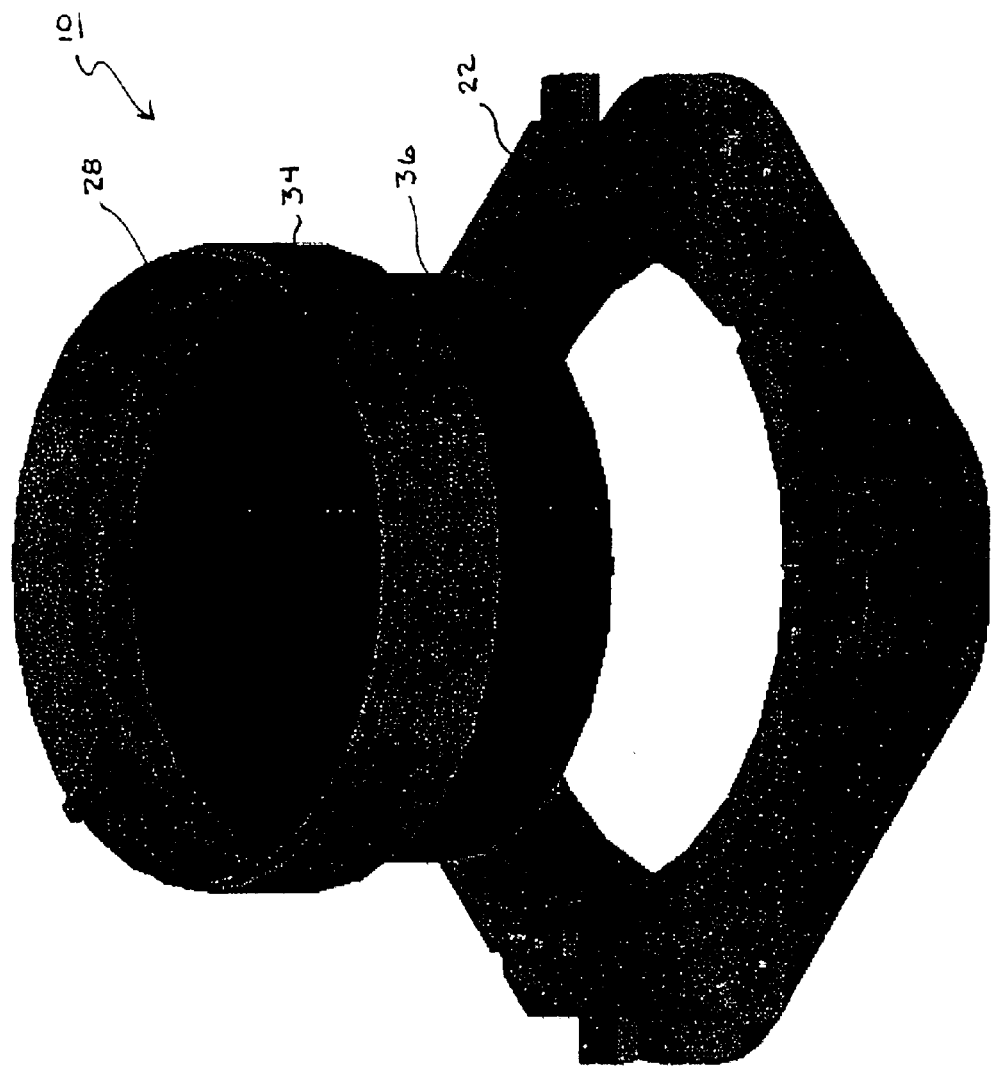
FIG. 3 is a partially exploded view of the shielding assembly of the present invention.
Figure 4:
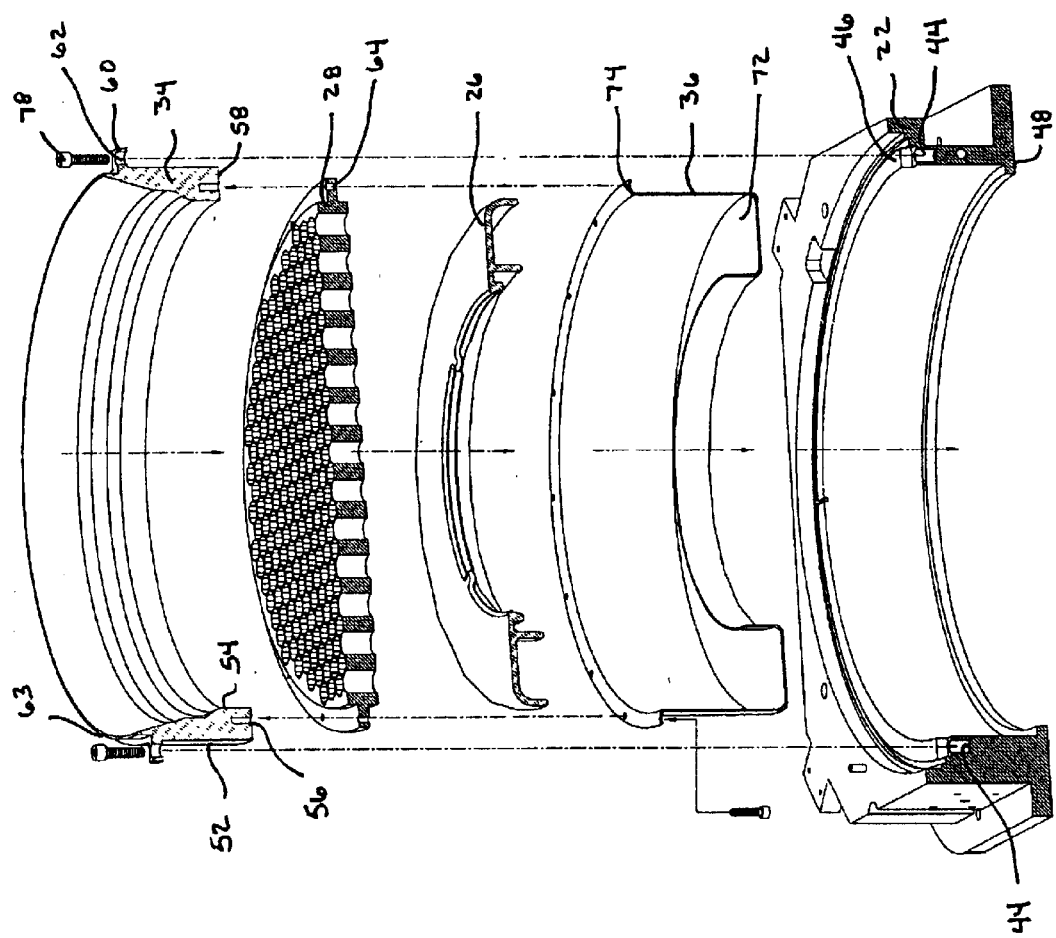
FIG. 4 is an exploded view of the shielding assembly of the present invention.

With reference now to FIG. 4 an exploded view of the shield assembly 10 is provided. FIG. 4 also illustrates the adapter plate 22 that serves to orient the shielding components of the present invention. The adapter plate 22, as is known in the art, functions in supporting a target assembly (not shown) above a wafer pedestal (not shown). The adapter plate 22 is coupled to the remaining chamber by way of fasteners in a manner known in the art.

The target assembly serves to interconnect a target material to the chamber enclosure. More specifically, the target assembly forms a cover over the chamber and retains the target material in facing relation to the interior of the chamber. Additionally, the target assembly is such that voltage can be applied to the target material, while at the time maintaining the chamber at ground. This is achieved by an insulated barrier between the target assembly and chamber. The application of a voltage to the target assembly biases the target material and enables sputtering and/or vapor deposition. This is typically achieved after an inert gas, such as argon, is supplied to the interior of the chamber. As previously indicated, the target material to be sputtered and/or evaporated can include metal such as aluminum, aluminum alloys, gold, copper, titanium and/or titanium-tungsten.

The substrate being processed is typically supported upon a movable pedestal. The pedestal allows the substrate to be raised to a position adjacent the target material. A transfer mechanism (not shown) is also included. The transfer mechanism allows a substrate to be positioned upon the pedestal. In a manner known in the art, such transfer mechanisms enable such positioning, while at the same time limiting the entrance of ambient air into the chamber.

Thus, before processing begins, the pedestal is raised to a location within the lower shield assembly. At this position, a clamping ring 26, positioned within the lower shield, contacts the pedestal and the periphery of the substrate. This clamping ring 26 functions in limiting the escape of deposited material from the space between the pedestal and lower shield. After contacting the clamping ring 26, the pedestal is raised higher, such that the ring 26 is raised from its location within the lower shield. Continued upward movement of the pedestal causes the substrate and clamping ring 26 to be positioned at a location immediately beneath the collimator 28. Once this position is achieved, deposition operations can begin.

The configuration of the adapter plate 22 is best illustrated with reference to FIG. 6. Specifically, the adapter plate 22 includes a central opening 32 for receipt of the upper and lower shield components (34 and 36). This central opening 32 is defined by an elongated upper, or first, cylindrical extent 38; and a second cylindrical extent 42 of a reduced diameter. Thus, the second cylindrical extent 42 forms a flange that runs around the entire inner periphery of the opening 32 at its lower extent. The function of this flange will be described in greater detail hereinafter.

The adapter 22 additionally includes a pair of opposed locking apertures 44 formed within its upper peripheral edge 46 (note FIG. 4). Preferably, these are threaded apertures 44 and function in receiving locking fasteners. Although two threaded apertures 44 have been described, other numbers and types of apertures can be employed. As is conventional, the upper surface of the adapter plate 22 also includes additional apertures for securing the target assembly. Likewise, the lower surface and the lower peripheral edge 48 of the adapter can include additional apertures, as needed, to secure the adapter within a deposition chamber.

The internal periphery of the adapter plate 22 is shielded from the target material by way of an upper shield component 34. The relationship between the upper shield 34 and the adapter plate 22 is best depicted with reference to FIG. 5. As illustrated, the upper shield 34 has a cylindrical outer surface 52 and an inner surface 54 which tapers outwardly from its upper to its lower peripheral edge (note FIG. 4). This tapering internal wall 54 functions in directing sputtered and/or evaporated material into a collimator 28 and down upon the substrate being processed.

The upper shield 34 also includes apertures. Namely, as depicted in FIG. 4, a series of threaded apertures 56 are formed within the lower peripheral edge 58 of the shield and are employed in securing the collimator 28 and a lower shield assembly 36 in a manner more fully described hereinafter. The upper shield 34 additionally includes a pair of opposed flanges 60. These flanges 60 are integrally formed with the upper peripheral edge 63 of the shield 34. In the preferred embodiment, each flange 60 has a threaded locking aperture 62 formed therein. The shield 34 can employ other numbers of flanges 60, however, the number of flanges should correspond to the number of apertures within the upper periphery of the adapter 22.

The upper shield 34 is dimensioned to fit within the central opening 32 of the adapter plate 22, such that the cylindrical outer surface 52 of the upper shield 34 contacts the upper cylindrical extent 38 of the adapter 22. With the adapter 22 and shield 34 so oriented, the lower peripheral edge 58 of the shield 34 rests upon the flange 42 formed around the lower periphery of the adapter 22. In other words, the outer diameter of shield 34 is greater than the inner diameter of flange 48 to prevent the shield 34 from passing through the central opening 32 of adapter plate 22. The flanges 60 and locking fasteners 78 of the upper shield 34 also serve to hold shield 34 tight against flange 48.

Figure 5:
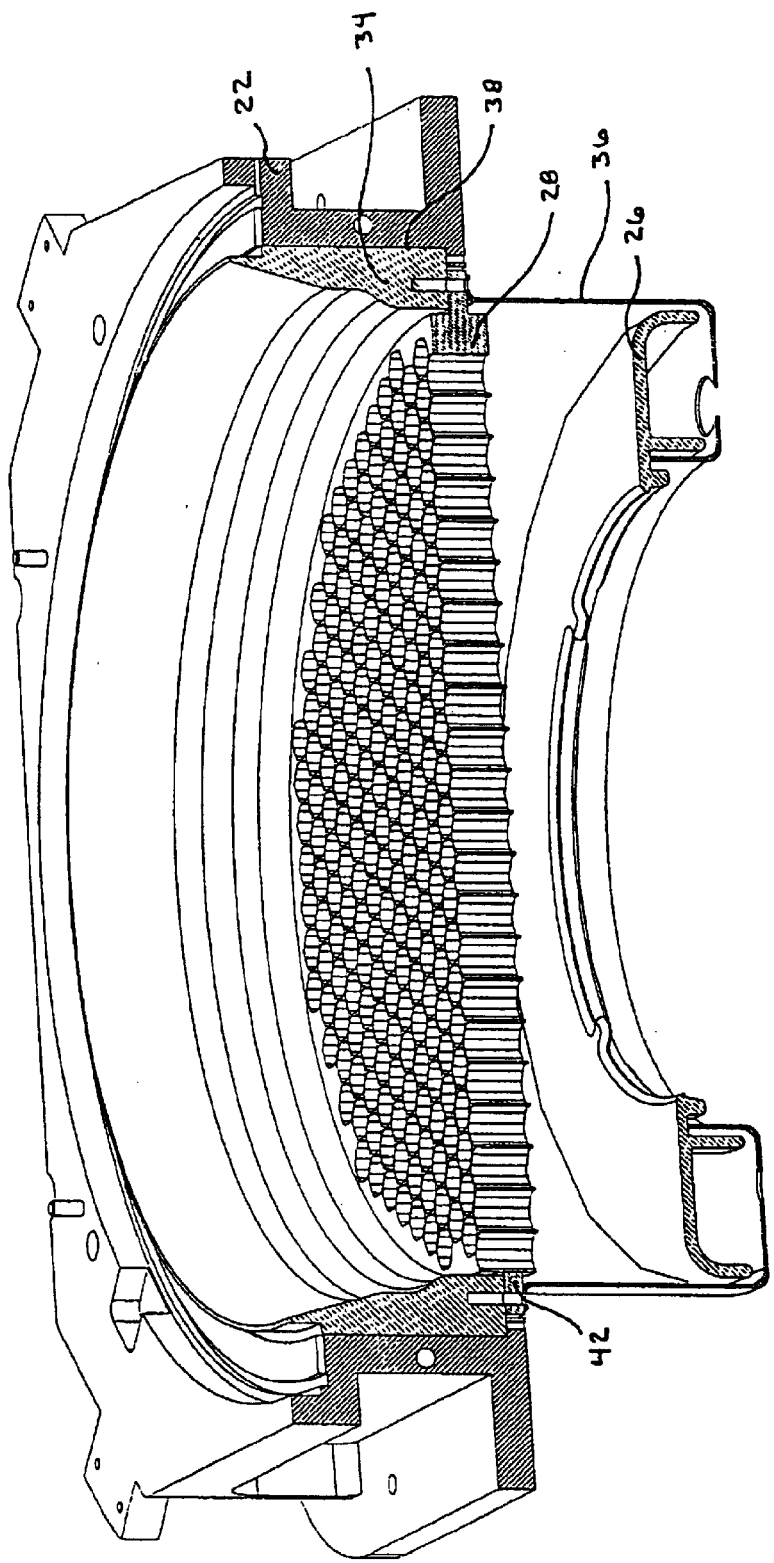
FIG. 5 is a cross-sectional perspective view of the shielding assembly of the present invention.

With continuing reference to FIG. 5, the target collimator 28 is described. Collimators are known in the art and are employed in directing the path of sputtered and/or evaporated materials towards the surface of the substrate being processed. This is accomplished by correcting the trajectory of sputtered and/or evaporated materials such that they take a path that is perpendicular to the face of the substrate. Collimator includes an apertured peripheral edge 64 of a reduced thickness. This permits the collimator 28 to be coupled to the lower periphery 42 of the upper shield 34 in a manner more fully described hereinafter.

Preferably, the adapter plate 22 is larger than the outer diameter of the collimator 28. Thus, with the upper shield 34 removed, the collimator 28 can pass through the central opening 32 of the adapter 22. In the preferred embodiment, the number of apertures 56 formed within the upper shield 34 correspond in number and position to the apertures within the peripheral edge of the collimator 28. This permits the collimator 28 to be secured to the upper shield 34, with the shield 34 resting upon the flange 48 of the adapter 22. This arrangement is most clearly illustrated with reference to FIGS. 5 and 6.

The lower shield 36 component is described next. The lower shield 36 is defined by an upper opening 66 of a first diameter and a lower opening 68 of a second reduced diameter. In the preferred embodiment, the outer diameter of the lower shield 36 is approximately the same as the outer diameter of the collimator 28. Thus, the outer diameter of the lower shield 36 is less than the inner diameter of the adapter 22. Consequently, in a manner similar to the collimator 28, the lower shield 36 is dimensioned to pass through the central opening 32 of the adapter 22.

Figure 6:
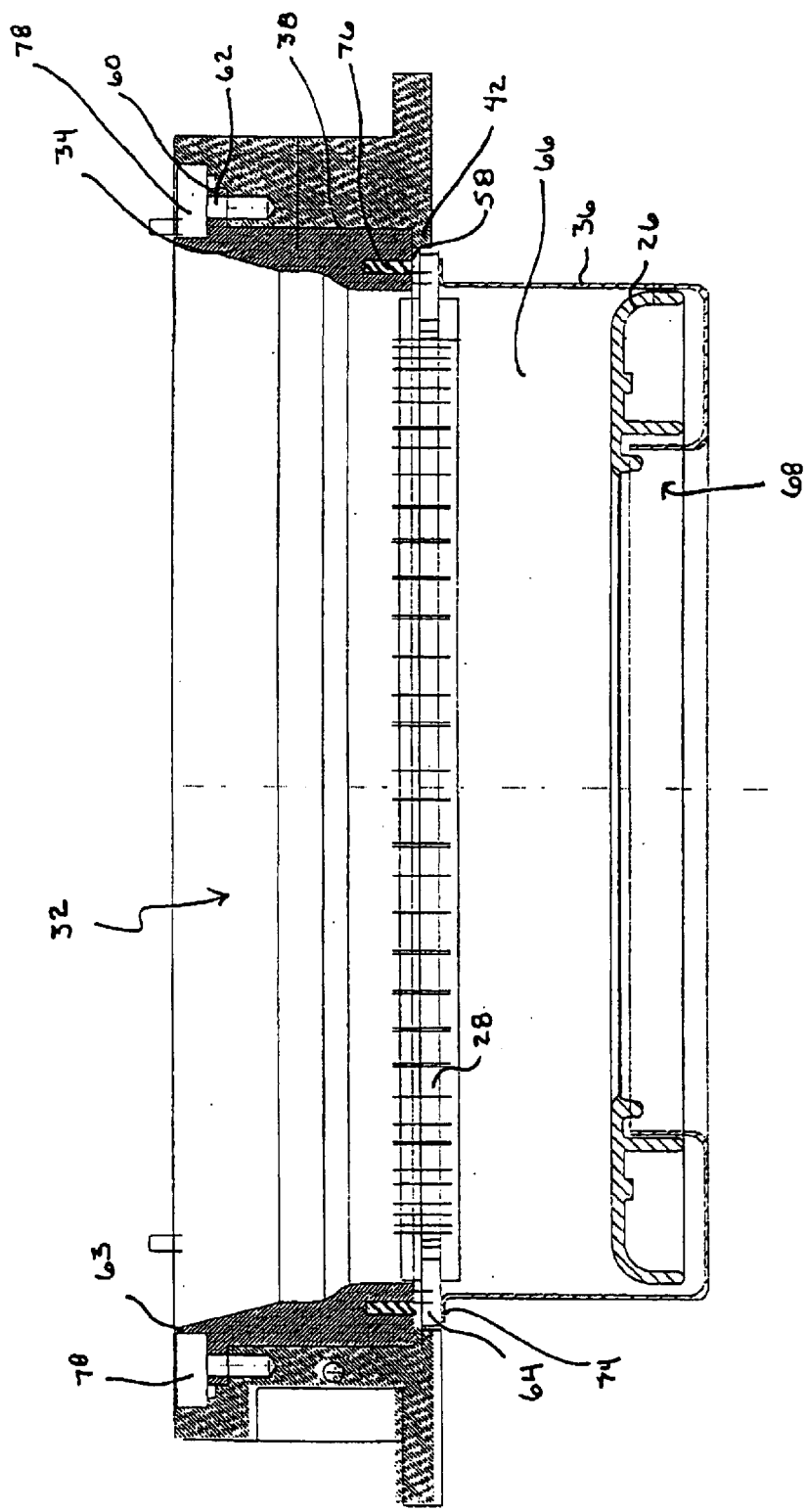
FIG. 6 is a cross-sectional view of the shielding assembly of the present invention.

Furthermore, as illustrated in FIG. 6, the lower opening 68 of the shield is formed by a U-shaped channel 72 formed around the lower periphery. This channel 72 is dimensioned to receive the clamp ring 26. This reduced diameter is also dimensioned to receive the wafer pedestal as it is moved to a position adjacent to the target assembly for processing. With continued reference to FIG. 6, the flanged upper end 74 of the lower shield 36 is depicted. This flange 74 is integral with the shield 36 and extends about the entire shield periphery. In the preferred embodiment, a series of apertures are formed within this flanged edge, with the number and positioning of apertures corresponding to the number and positioning of apertures within the collimator and the upper shield component. This permits the three components to be secured to one another with fasteners.

More specifically, a series of threaded fasteners 76 are employed in securing the collimator 28 intermediate the upper and lower shield components (34 and 36). These threaded fasteners 76 are positioned through the apertures of the lower shield assembly 36, the apertures in the collimator 28 and are thereafter fastened within the threaded apertures of the upper shield component 34. This permits the lower shield 36 and collimator 28 to be removably secured to the lower peripheral edge 58 of the upper shield 34. The arrangement also permits the upper shield component 34, the collimator 28, and the lower shield component 36 to act as a single shielding unit that can be conveniently removed from the upper end of the adapter 22. Preferably, this shielding unit has a length that is longer than the length of the central opening.

A pair of locking fasteners 78 are employed in securing the shielding unit to the adapter plate 22. Specifically, with the apertured flanges 60 of the upper shield 34 component aligned with the locking apertures or holes 44 of the adapter 22, a pair of locking fasteners 78 can be removably secured within the locking apertures 44. Although two locking apertures and fasteners have been described as preferred, other numbers and types of fasteners are within the scope of the present invention.

With the locking fasteners in place, the collimator and two shield components are secured within the adapter plate to prevent sputtered materials from accumulating upon the inner components of the deposition chamber. Sputtered materials will, however, accumulate upon the internal surfaces of the upper and lower shields. After such materials have accumulated to an undesirable amount, the two locking fasteners can be removed from the adapter plate. This then permits the upper adapter plate, the lower adapter plate and the collimator to be removed as a single unit from the upper surface of the adapter. In that regard, the outer diameter of the lower shield component and collimator are small enough to pass through the central aperture of the adapter. Preferably, an operator will have a fresh and fully assembled shielding unit ready for insertion into the adapter. This permits a quick and easy installation with the new unit being secured via the locking fasteners in the manner previously described. This arrangement drastically reduces the amount of chamber down time in that there is no need to remove the adapter from the deposition chamber. Additionally, the shielding arrangement of the present invention limits the exposure of the chamber interior to the ambient environment.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. An improved shield assembly for a substrate processing chamber comprising:

an adapter plate functioning to support a target assembly, the plate having a central opening defined by a first cylindrical extent of a first diameter and a second cylindrical extent of a second reduced diameter, the adapter having upper and lower peripheral edges, a pair of opposed locking apertures formed within the upper peripheral edge;

an upper shield having upper and lower peripheral edges, a series of threaded apertures formed within the lower peripheral edge an d a pair of opposed flanges integral with the upper peripheral edge, each of the flanges having a locking aperture formed therein, the upper shield having a side wall which tapers outwardly from the upper to the lower peripheral edge, the shield being positioned within the central opening of the adapter such that the lower peripheral edge of the upper shield abuts the second cylindrical extent of the adapter with the locking apertures of the upper shield and adapter being aligned;

a target collimator having a diameter and an apertured peripheral edge, the peripheral edge being positioned adjacent the lower peripheral edge of the upper shield such that the apertures of the collimator are aligned with the threaded apertures of the upper shield;

a lower shield defined by an upper opening of a first diameter and a lower opening of a second reduced diameter, the lower opening functioning to receive a wafer pedestal, the upper opening having a flanged peripheral edge, with apertures formed therein. the lower shield being positioned adjacent the peripheral edge of the target collimator, such that the apertures of the collimator are aligned with the apertures of the lower shield;

a series of threaded fasteners secured within the apertures of the lower shield, the apertures of the collimator and the threaded apertures of the upper shield, the series of fasteners serving to secure as a unit the collimator and the upper and lower shields;

a pair of locking fasteners removably secured within the locking apertures of the upper shield and adapter, the locking fasteners permitting the collimator, the upper shield, and the lower shield to be removed from the adapter as a unit, with the first diameter of the lower shield and the diameter of the collimator being smaller than the diameter of the second cylindrical extent thereby permitting removal from the upper peripheral edge of the adapter.

2. A shielding system for use within a substrate processing chamber comprising:

an adapter plate functioning to support a target assembly, the adapter plate having an opening with a length and upper and lower peripheral edges;

a shield assembly with a length greater than the length of the opening, fasteners removably securing the shield assembly to the upper periphery of the opening, wherein the entire shield assembly can be removed from the opening as a single unit upon removal of the fasteners, the shield assembly comprises upper and lower shield components and a collimator secured intermediate the upper and lower shield components.

3. The shielding system as described in claim 2 wherein the opening of the adapter plate includes a lower peripheral flange, and wherein the upper shield component includes a lower peripheral edge that rests upon the peripheral flange when the shield assembly is positioned within the opening.

4. The shielding system as described in claim 3 wherein the collimator and lower shield component are removably secured to the lower peripheral edge of the upper shield component.

5. The shielding system as described in claim 2 wherein the shield assembly is secured to the upper periphery of the opening by way of threaded fasteners.

6. The shielding system as described in claim 2 wherein the shield assembly includes a lower extent and wherein when the shield assembly is positioned within the opening, the lower extent of the shield assembly is positioned below the lower peripheral edge of the opening.

7. An improved deposition chamber for depositing a target material onto a substrate, the chamber comprising:

an adapter plate secured within the deposition chamber, the plate having an upper surface for receipt of the target material and a lower surface adapted to be positioned over the substrate, an opening formed within the adapter, the opening having an inner periphery;

a shielding assembly including an upper shield component removably coupled to a lower shield component, the upper shield component being removably coupled to the inner periphery of the opening, wherein removal of the entire shield assembly can be accomplished as a single unit without removing the adapter plate.

8. The improved deposition chamber as described in claim 7 wherein the shield assembly is removably secured to the opening by way of threaded fasteners.

9. The improved deposition chamber as described in claim 7 wherein the upper and lower shield components are interconnected by way of threaded fasteners.

10. An improved deposition chamber for depositing a target material onto a substrate, the chamber comprising:

an adapter plate secured within the deposition chamber, the plate having an upper surface for receipt of the target material and a lower surface adapted to be positioned over the substrate, an opening formed within the adapter, the opening having an inner periphery;

a shielding assembly including an upper shield component removably coupled to a lower shield component, the upper shield component being removably coupled to the inner periphery of the opening, wherein the shield assembly further includes a collimator interconnected intermediate the upper and lower shield components, wherein the collimator, upper shield component and lower shield component are removably interconnected to one another by way of threaded fasteners.

* * * * *